(12) United States Patent
Maki

(10) Patent No.: US 6,237,122 B1
(45) Date of Patent: *May 22, 2001

(54) SEMICONDUCTOR MEMORY DEVICE HAVING SCAN FLIP-FLOPS

(75) Inventor: Takashi Maki, Kawasaki (JP)

(73) Assignee: Fujitsu Limited, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/089,399

(22) Filed: Jun. 3, 1998

(30) Foreign Application Priority Data

Nov. 7, 1997 (JP) .................................. 9-305937

(51) Int. Cl.[7] .................................................. G01R 31/28
(52) U.S. Cl. .......................................... 714/730; 714/727
(58) Field of Search .................................. 714/726, 727, 714/729, 730; 327/203; 365/201

(56) References Cited

U.S. PATENT DOCUMENTS

| | | | |
|---|---|---|---|
| 4,947,380 | * 8/1990 | van Zanten et al. | 365/238 |
| 5,015,875 | 5/1991 | Giles et al. | 327/203 |
| 5,477,493 | 12/1995 | Danbayashi | 365/201 |
| 5,519,714 | * 5/1996 | Nakamura et al. | 714/726 |
| 5,574,731 | 11/1996 | Qureshi | 714/726 |
| 5,719,876 | * 2/1998 | Warren | 714/718 |
| 5,805,608 | * 9/1998 | Baeg et al. | 714/726 |
| 5,812,562 | * 9/1998 | Baeg | 714/726 |
| 6,028,810 | * 2/2000 | Ooishi | 365/230.03 |
| 6,032,268 | * 2/2000 | Swoboda et al. | 714/30 |
| 6,035,362 | * 3/2000 | Goodrum et al. | 710/128 |

OTHER PUBLICATIONS

Copy of Korean Patent Office Notice Requesting Submission of Opinion for corresponding Korean Patent Application No. 10–1998–0021222 dated Sep. 22, 2000.

Cheng (Partial scan Designs without using a separate Scan Clock; IEEE, May 1995).*

* cited by examiner

Primary Examiner—Albert DeCady
Assistant Examiner—Guy Lamane
(74) Attorney, Agent, or Firm—Armstrong, Westerman, Hattori, McLeland & Naughton, LLP

(57) ABSTRACT

A semiconductor memory device includes a plurality of scan flip-flops connected in series for storing parallel data externally provided in a normal operation mode and for storing serial data externally provided in a scan mode by shifting the serial data. The semiconductor memory device further includes a control circuit which controls the plurality of scan flip-flops to refrain from shifting the serial data when data-read operations and data-write operations are conducted in the scan mode.

7 Claims, 11 Drawing Sheets

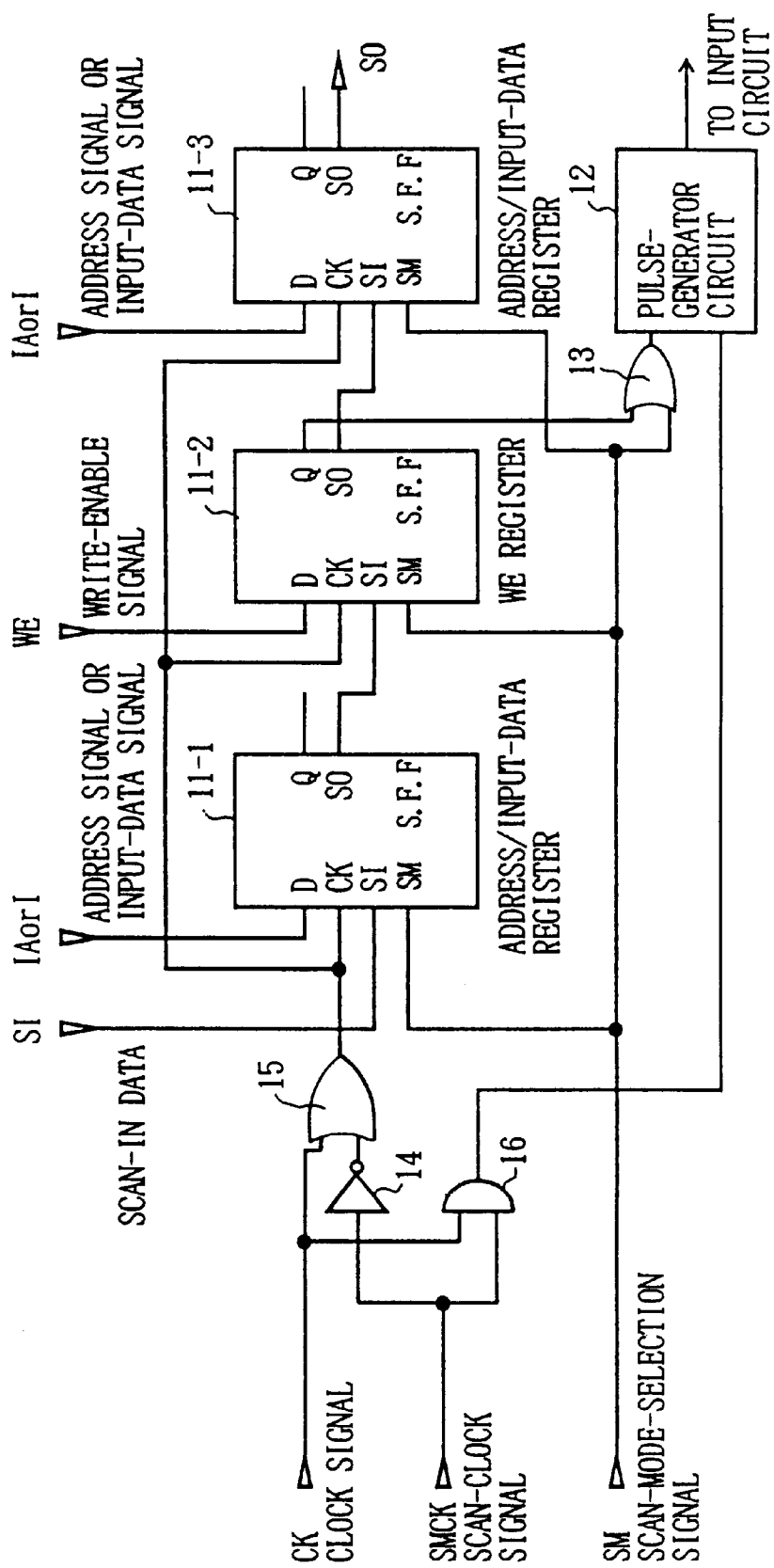
F I G. 3

| CK | SM | SMCK | WE | SDI | SDO | IAx | Ix | Ax | SELECTED MODE |
|---|---|---|---|---|---|---|---|---|---|
| ↑ | L | H | H | X | X | IAx | Ix | Ax | DATA-READ OPERATION |
| ↑ | L | H | L | X | X | IAx | X | Ax | DATA-WRITE OPERATION |

FIG. 8A

| CK | SM | SMCK | WE | SDI | SDO | IAx | Ix | Ax | SELECTED MODE |
|---|---|---|---|---|---|---|---|---|---|
| ↑ | H | H | X | SDI | SDO | X | X | X | SCAN-SHIFT OPERATION |
| H | L | ↑ | X | X | Hold Data | X | X | Ax or X | NON-SCAN-SHIFT-WRITE OPERATION |
| H | H | ↑ | X | X | Hold Data | X | X | Ax | NON-SCAN-SHIFT-READ OPERATION |
| ↑ | L | L | X | X | Hold Data | X | X | Hold Data | EXTERIOR-FF-LATCH OPERATION |

SEMICONDUCTOR MEMORY DEVICE HAVING SCAN FLIP-FLOPS

BACKGROUND OF THE INVENTION

1. Field of the Invention

The present invention generally relates to semiconductor memory devices, and particularly relates to a semiconductor memory device having a test circuit.

2. Description of the Related Art

A digital signal processor or the like has a logic circuit and a semiconductor memory device such as a DRAM combined together and implemented on the same chip. When a semiconductor memory device is combined with a logic circuit on a single chip in this manner, a scan mode of the semiconductor memory device is typically used for testing operations of the semiconductor memory device.

Input buffers of a semiconductor memory device such as a command buffer, an address-input buffer, a data-input buffer, etc., are provided with scan flip-flops (hereinafter referred to simply as FFs) for the purpose of scanning. The scan FFs receive command-signal inputs from command-input nodes, address-signal inputs from address-input nodes, and data-signal inputs from data-input nodes, and supply data of those inputs to internal circuits inside the semiconductor memory device. When the semiconductor memory device is provided on a single chip together with a logic circuit as previously described, user logic implemented by the logic circuit are formed between the exterior of the chip and the input points of the semiconductor memory device where the semiconductor memory device receives the command inputs, the address inputs, the data inputs, etc. Because of the intervening user logic, a test pattern, which is specified by the manufacturer of the semiconductor memory device, cannot be set with respect to the command inputs, the address inputs, and the data inputs from the exterior of the chip.

Such a case may require use of the scan mode. In the scan mode, the scan FFs receive data input to a scan-in-data node SI, which receives an input thereto directly from the exterior of the chip. This allows a test pattern to be set in the semiconductor memory device by bypassing the intervening user logic implemented by the logic circuit.

FIG. 1 is a block diagram of a test circuit using a related-art scan mode.

The test circuit of FIG. 1 includes scan FFs 201-1 through 201-3, a pulse-generator circuit 202, an OR circuit 203, and an AND circuit 204. The scan FF 201-1 receives an address signal IA or a data signal I input to the semiconductor memory device. The scan FF 201-2 receives a write-enable signal WE input to the semiconductor memory device. The scan FF 201-3 receives an address signal IA or a data signal I input to the semiconductor memory device. In FIG. 1, the scan FFs 201-1 through 201-3 are shown as if only one scan FF receives a particular type of a signal such as an address signal or a data signal. In practice, however, a plurality of scan FFs are provided in accordance with the number of bits included in the input-address signals IA and the input-data signals I.

Each of the scan FFs 201-1 through 201-3 also receives a scan-mode-selection signal SM, and selects either the D input or the SI input according to the scan-mode-selection signal SM, thereby latching a selected input in synchronism with a clock signal CK supplied to the CK input.

FIG. 2 is a block diagram showing a configuration of a given one of the scan FFs 201-1 through 201-3. Each of the scan FFs 201-1 through 201-3 includes a two-input selector 211 and a FF 212. The two-input selector 211 selects the SI input when the scan-mode-selection signal SM is HIGH, for example, and selects the I input when the scan-mode-selection signal SM is LOW. The selected input is stored in the FF 212 in synchronism with the clock signal CK.

As shown in FIG. 1, the SO output of the scan FFs 201-1 and 201-2 is connected to the SI input of the next scan FF. In this manner, the scan FFs 201-1 through 201-3 are connected in a chain structure. This chain structure makes it possible to store serial data in the scan FFs 201-1 through 201-3 by shifting the serial data one bit by one bit when the serial data is successively supplied from the scan-in-data node SI.

Once the test pattern is set in the scan FFs 201-1 through 201-3, a scan-write signal LD is changed to HIGH so as to supply a write signal to the internal circuits of the semiconductor memory device, thereby writing the test pattern in the internal circuits. The pulse-generator circuit 202 generates a pulse in response to a rising edge of the clock signal CK when the scan-mode-selection signal SM is HIGH. The pulse signal generated by the pulse-generator circuit 202 in the scan mode is supplied to the AND circuit 204 via the OR circuit 203. When the scan-write signal LD is set to HIGH, therefore, the pulse signal from the pulse-generator circuit 202 is supplied as a write signal to the internal circuits of the semiconductor memory device.

The test circuit as described above is used in the scan mode to conduct a test on the semiconductor memory device. One of the test patterns typically used for testing a memory is a march pattern. A test based on the march pattern is performed by:

1. successively writing data in an address by starting from the smallest address to the largest address, where the data has all bits thereof being 0 or all bits thereof being 1;
2. successively reading the data from an address and writing opposite data in the same address by incrementing the address from the smallest address to the largest address;
3. successively reading the data from an address and writing opposite data in the same address by proceeding from the largest address to the smallest address; and
4. successively writing data in an address by starting from the smallest address to the largest address, where the data written at this step is opposite to the data written at the above step 1, and, then, repeating the steps 2 and 3.

In this manner, the data-write/read operations described above are conducted so as to check whether the data read from the memory matches the data written in the memory. This completes an operation test with respect to each memory cell.

There is a problem associated with the related-art scan-mode-test circuit shown in FIG. 1 when this circuit is used for conducting the above-described test. Namely, when a given address is set for the purpose of a data-read operation and data is read from this address, data stored in the scan FFs experiences a data shift, thereby making an undesirable change to the address data. When data is to be written in the same address, the scan FFs need to be set again by inputting the data and the address one bit by one bit. This results in an excessive amount of labor and a lengthy time for conducting the test.

Accordingly, there is a need for a semiconductor memory device which does not require scan FFs to be set again when conducting a write operation immediately after a read operation in the scan mode.

SUMMARY OF THE INVENTION

Accordingly, it is a general object of the present invention to provide a semiconductor memory device which can satisfy the need described above.

It is another and more specific object of the present invention to provide a semiconductor memory device which does not require scan FFs to be set again when conducting a write operation immediately after a read operation in the scan mode.

In order to achieve the above objects, a semiconductor memory device according to the present invention includes a plurality of scan flip-flops connected in series for storing parallel data externally provided in a normal operation mode and for storing serial data externally provided in a scan mode by shifting the serial data. The semiconductor memory device further includes a control circuit which controls the plurality of scan flip-flops to refrain from shifting the serial data when data-read operations and data-write operations are conducted in the scan mode.

In the semiconductor memory device described above, when the data-read operations and the data-write operations are conducted in the scan mode, the control circuit controls the operations so as not to make any undesirable change to the data stored in the scan FFs. When data is to be written in a given address immediately after data is read from the same address, therefore, there is no need to set the scan FFs again by inputting the data and the address one bit by one bit. This achieves a reduction in labor required for setting a test pattern, and, also, serves to shorten the test time.

According to one aspect of the present invention, the control circuit controls supply of the clock signal to the plurality of scan FFs so as to achieve operation control avoiding a data shift in the scan FFs.

According to another aspect of the present invention, the supply of the clock signal is controlled by a simple circuit which performs a logic operation between a control signal and the clock signal.

According to another aspect of the present invention, data-read operations and data-write operations are performed under the control of the control circuit, so that the data-read operations and the data-write operations are conducted at appropriate timings.

According to another aspect of the present invention, a pulse generator circuit operating under the control of the control circuit controls an activation timing and an activated time length of a word line, so that the data-read operations and the data-write operations are conducted at appropriate timings.

According to another aspect of the present invention, LSSD-type flip-flops are used as the plurality of scan FFs, so that reliable data-shift operations and data storing operations can be achieved.

According to another aspect of the present invention, the scan FFs are controlled with respect to each port, so that data-read operations and data-write operations can be conducted independently with respect to each port.

Other objects and further features of the present invention will be apparent from the following detailed description when read in conjunction with the accompanying drawings.

BRIEF DESCRIPTION OF THE DRAWINGS

FIG. 3 is a block diagram of a scan-mode-test circuit according to a principle of the present invention;

FIGS. 8A and 8B are table charts showing logic relations between signals with regard to operations of the scan-mode-test circuit of FIG. 3;

DESCRIPTION OF THE PREFERRED EMBODIMENTS

In the following, a principle and embodiments of the present invention will be described with reference to the accompanying drawings.

FIG. 3 is a block diagram of a scan-mode-test circuit according to a principle of the present invention.

Figure 1:
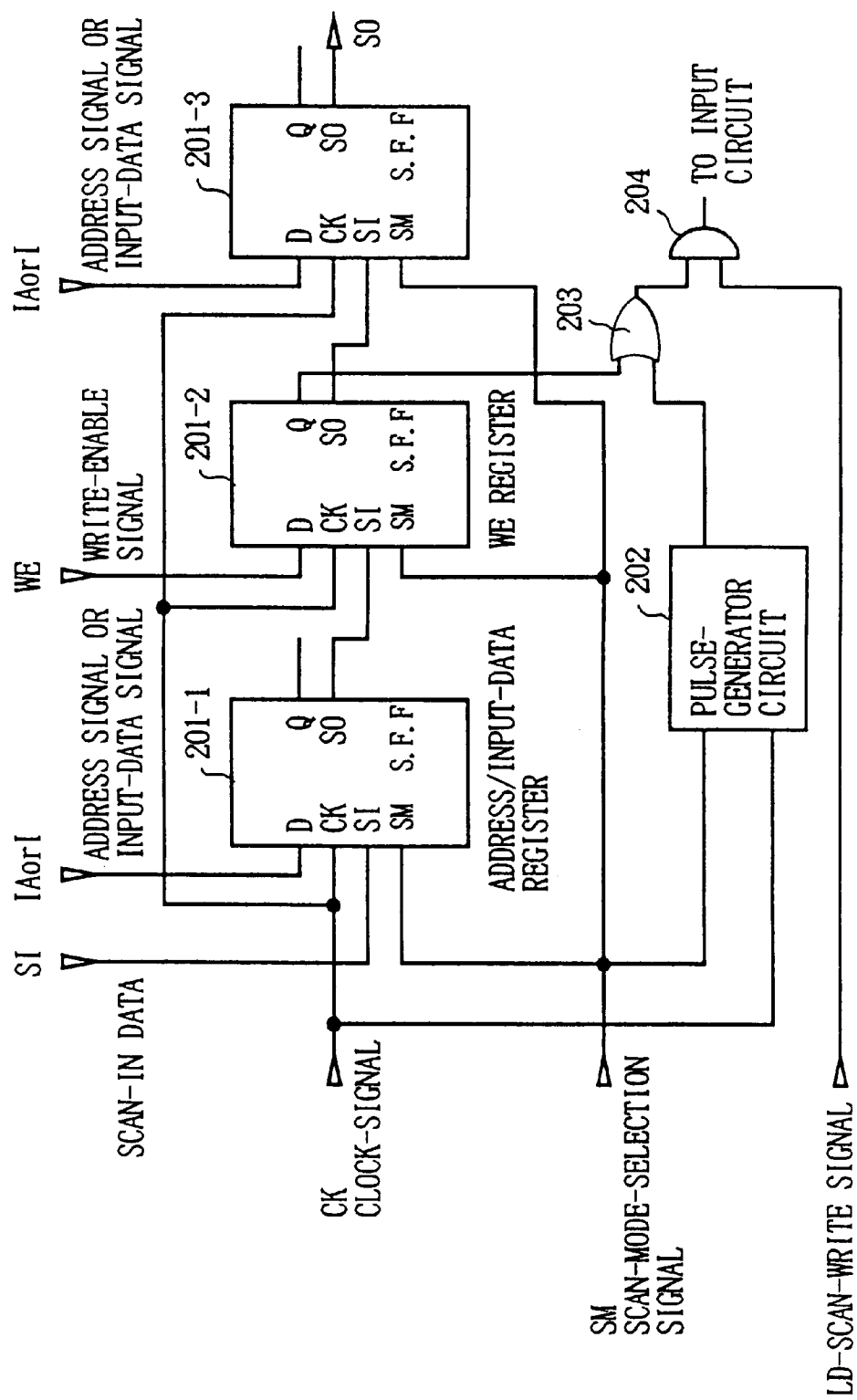
FIG. 1 is a block diagram of a test circuit using a related-art scan mode.
Figure 2:
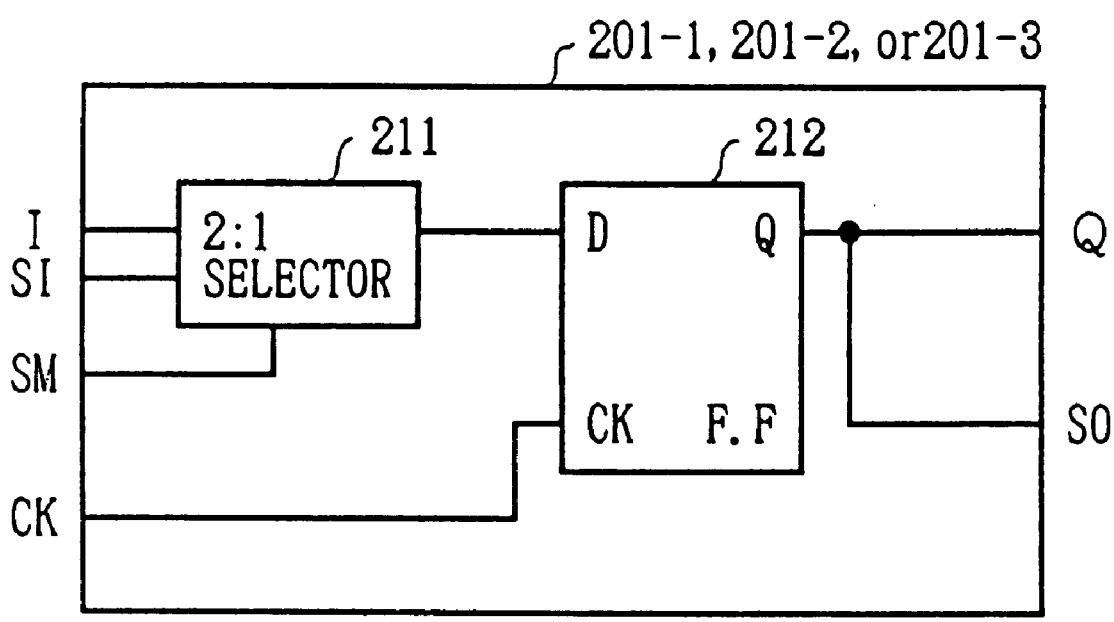
FIG. 2 is a block diagram showing a configuration of a given one of the scan FFs shown in FIG. 1.

A scan-mode-test circuit 10 of FIG. 3 includes scan FFs 11-1 through 11-3, a pulse-generator circuit 12, an OR circuit 13, an inverter 14, an OR circuit 15, and an AND circuit 16. The scan FFs 11-1 through 11-3 have the same configuration as that of the scan FFs 201-1 through 201-3 of FIG. 1, and such a configuration is shown in FIG. 2.

The scan FF 11-1 receives an address signal IA or a data signal I input to the semiconductor memory device. The scan FF 11-2 receives a write-enable signal WE input to the semiconductor memory device. The scan FF 11-3 receives an address signal IA or a data signal I input to the semiconductor memory device. In FIG. 3, the scan FFs 11-1 through 11-3 are shown as if only one scan FF receives a particular type of a signal such as an address signal or a data signal. In practice, however, a plurality of scan FFs are provided in accordance with the number of bits included in the input-address signals IA and the input-data signals I.

Each of the scan FFs 11-1 through 11-3 also receives a scan-mode-selection signal SM. Each of the scan FFs 11-1 through 11-3 selects the D input when the scan-mode-selection signal SM is LOW, and selects the SI input when the scan-mode-selection signal SM is HIGH. The selected input is latched in synchronism with a clock signal CK supplied to the CK input. The SO output of the scan FFs 11-1 and 11-2 is connected to the SI input of the next scan FF. The scan FFs 11-1 through 11-3 are thus connected in a chain structure.

When a scan-clock signal SMCK is HIGH, an output of the inverter 14 is LOW, so that the OR circuit 15 allows the clock signal CK to pass therethrough without any change. The clock signal CK is therefore supplied to the CK input of the scan FFs 11-1 through 11-3 via the OR circuit 15. In this case, serial data can be stored in the scan FFs 11-1 through 11-3 by shifting the serial data one bit by one bit via the chain connection when the serial data is successively supplied from the scan-in-data node SI.

In this manner, the scan mode indicated by the HIGH level of the scan-mode-selection signal SM allows a test pattern to be successively input to the scan-in-data node SI, and makes a bit-wise shift of the input data in synchronism with the clock signal CK so as to set the test pattern in the scan FFs 11-1 through 11-3. Here, the scan-in-data node SI receives input thereto directly from the exterior of the chip.

Once the test pattern is set in the scan FFs 11-1 through 11-3, a data-read pulse is supplied to the internal circuits of the semiconductor memory device, thereby performing a data-read operation. Then, a data-write pulse is supplied to write the test pattern, which has been stored in the scan FFs 11-1 through 11-10 3.

The pulse-generator circuit 12 generates the data-read pulse and the data-write pulse described above.

The data-write pulse is generated in response to a rising edge of an output signal from the AND circuit 16 when the output of the OR circuit 13 is LOW.

The generated data-write pulse is supplied to the internal circuits of the semiconductor memory device, thereby writing the test pattern in memory cells after the test pattern is stored in the scan FFs 11-1 through 11-3. When the output of the OR circuit 13 is HIGH, no data-write pulse is generated.

The data-read pulse is generated in response to a rising edge of the output signal from the AND circuit 16 when the output of the OR circuit 13 is HIGH. The generated data-read pulse is supplied to the internal circuits of the semiconductor memory device, thereby reading the test pattern from the memory cells. When the output of the OR circuit 13 is LOW, no data-read pulse is generated.

When the test pattern needs to be set in the scan FFs 11-1 through 11-3 as described above, the scan-clock signal SMCK is kept at a HIGH level, and a pulse of the clock signal CK is supplied. Since the output of the OR circuit 13 is HIGH in this case, no data-write operation is carried out.

After the test pattern is set in this manner, the data-read and data-write operations are conducted. At the time of the data-read operation, the clock signal CK is fixed at the HIGH level, and the scan-clock signal SMCK is changed. This allows the pulse-generator circuit 12 to generate a data-read pulse at a rising edge of the scan-clock signal SMCK. Since the scan-mode-selection signal SM is kept at a HIGH level thereof, the output of the OR circuit 13 is also HIGH, so that the pulse-generator circuit 12 is ready to generate a data-read pulse in this case. Further, the clock signal CK is fixed at the HIGH level, so that the output of the OR circuit 15 remains at a HIGH level at all times, thereby making no change to the data in the scan FFs 11-1 through 11-3.

At the time of the data-write operation, the clock signal CK is fixed at the HIGH level, and the scan-clock signal SMCK is changed. This allows the pulse-generator circuit 12 to generate a data-write pulse at a rising edge of the scan-clock signal SMCK. The scan-mode-selection signal SM is set to LOW in this case, and the scan FF 11-2 stores a LOW signal reflecting the active state of the write-enable signal. Because of this, the output of the OR circuit 13 is LOW, and, thus, the pulse-generator circuit 12 is ready to generate a data-write pulse in this case. Further, the clock signal CK is fixed at the HIGH level, so that the output of the OR circuit 15 remains at the HIGH level at all times, thereby making no change to the data in the scan FFs 11-1 through 11-3.

As described above, the scan-mode-test circuit 10 according to the present invention sets data in the scan FFs, and performs data-read/write operations without making any undesirable change to the data stored in the scan FFs. When data is to be written in an address immediately after data is read from the same address, therefore, there is no need to set the scan FFs again by inputting the data and the address one bit by one bit. This achieves a reduction in labor required for setting a test pattern, and, also, serves to shorten the test time.

Figure 4:
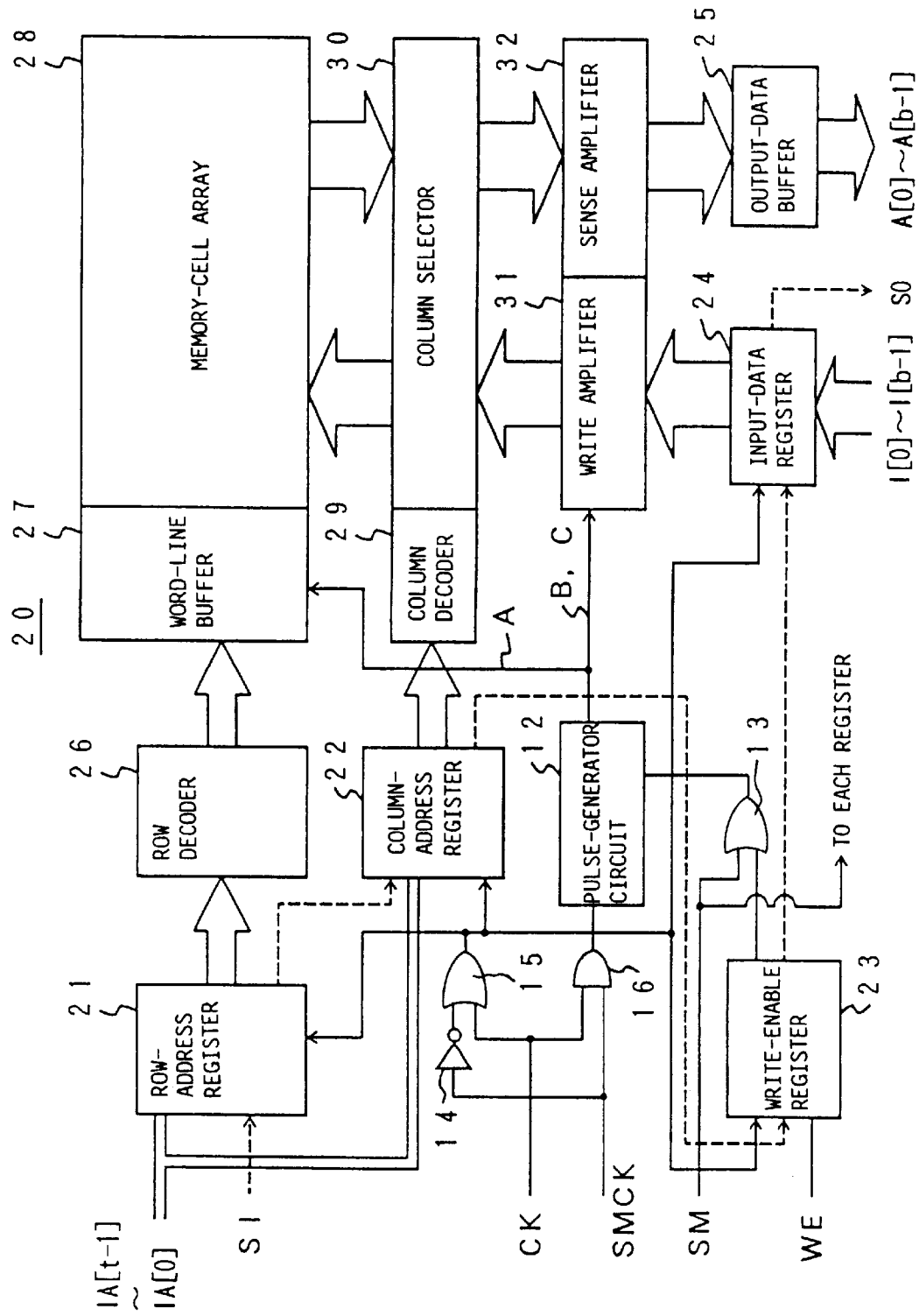
FIG. 4 is a block diagram of a semiconductor memory device according to an embodiment of the present invention.

FIG. 4 is a block diagram of a semiconductor memory device according to an embodiment of the present invention. In FIG. 4, the same elements as those of FIG. 3 are referred to by the same numerals, and a description thereof will be omitted. FIG. 4 shows an example in which the present invention is applied to a DRAM.

A semiconductor memory device 20 of FIG. 4 includes the OR circuit 13, the inverter 14, the OR circuit 15, the AND circuit 16, a row-address register 21, a column-address register 22, a write-enable register 23, an input-data register 24, an output-data buffer 25, a row decoder 26, a word-line buffer 27, a memory-cell array 28, a column decoder 29, a column selector 30, a write amplifier 31, and a sense amplifier 32.

Operations of the semiconductor memory device in the normal-operation mode are the same as those of the related art, and only a brief description thereof will be provided below.

A row address supplied to the row-address register 21 is decoded by the row decoder 26, thereby activating a selected word line of the word-line buffer 27. Data of memory cells corresponding to the activated word line is read from the memory-cell array 28.

A column address supplied to the column-address register 22 is decoded by the column decoder 29. According to the decoding results of the column decoder 29, the column selector 30 selects data of the indicated column address from the whole array of data read from the memory-cell array 28, and supplies the data to the sense amplifier 32. The data of the sense amplifier 32 is then output to the exterior of the semiconductor memory device 20 via the output-data buffer 25.

At the time of data-write operations, the write-enable signal WE, which is input to the write-enable register 23, is activated. This results in a data-write pulse being supplied to the write amplifier 31, so that data input to the input-data register 24 is written at the indicated row address of the indicated column address.

In what follows, operations of the scan mode will be described.

The scan mode is set by changing the scan-mode-selection signal SM to HIGH. The scan FFs 11-1 through 11-3 shown in FIG. 3 represent a set of input registers provided in the semiconductor memory device, and correspond to the row-address register 21, the column-address register 22, the write-enable register 23, and the input-data register 24 of FIG. 4. As shown in FIG. 3, the scan-mode-selection signal SM is supplied to each of the scan FFs 11-1 through 11-3. In FIG. 4, however, signal lines for conveying the scan-mode-selection signal SM to the row-address register 21, the column-address register 22, the write-enable register 23, and the input-data register 24 are omitted for the sake of clarity of the figure.

The row-address register 21, the column-address register 22, the write-enable register 23, and the input-data register 24 are connected together in a chain structure as shown by dashed lines in FIG. 4. An input end of the chain connection is the SI input, and the output end is the SO output.

Data supplied to the SI input can be successively shifted through the chain by supplying pulses of the clock signal CK when the scan-mode-selection signal SM is set to HIGH to indicate the scan mode. In this manner, the data input to the SI input can be set in the row-address register 21, the column-address register 22, the write-enable register 23, and the input-data register 24.

After the data is set to each register in the scan mode, various operations can be conducted. Data may be read from an address stored in the row-address register 21 and the column-address register 22, or data stored in the input-data register 24 may be written in the specified address. Such read/write operations are conducted as the pulse-generator circuit 12 generates pulse signals in response to changes in the scan-clock signal SMCK. During these operations, the clock signal CK is kept at a HIGH level to maintain the output of the OR circuit 15 at a HIGH level, so that the data set in each register is not changed.

Figure 5:
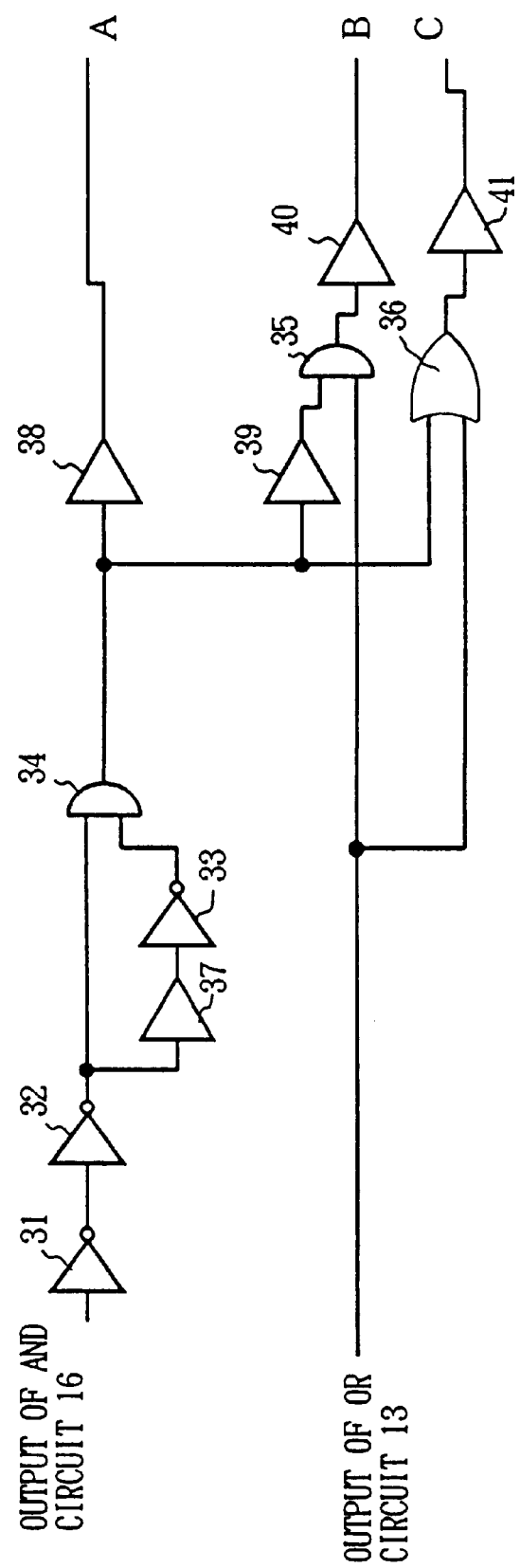
FIG. 5 is a circuit diagram of the pulse-generator circuit.

FIG. 5 is a circuit diagram of the pulse-generator circuit 12.

The pulse-generator circuit 12 of FIG. 5 includes inverters 31 through 33, AND circuits 34 and 35, an OR circuit 36, and buffer circuits 37 through 41. The AND circuit 34 performs an AND operation between an output of the AND circuit 16 and a delayed inverse of this output, thereby generating a HIGH pulse in response to a rising edge of the output of the AND circuit 16. This HIGH pulse is supplied via the buffer circuit 38 to the word-line buffer 27 of FIG. 4 as a word-line-activation pulse A.

When an output of the OR circuit 13 is HIGH, the above-described HIGH pulse is further supplied to the sense amplifier 32 of FIG. 4 as a data-read pulse B via the buffer circuit 39, the AND circuit 35, and the buffer circuit 40. This makes it possible to read data from the semiconductor memory device 20.

When the output of the OR circuit 13 is LOW, the above-described HIGH pulse is further supplied to the write amplifier 31 of FIG. 4 as a data-write pulse C via the OR circuit 36 and the buffer circuit 41. This makes it possible to write data from the semiconductor memory device 20. Here, configurations of the write amplifier 31 and the sense amplifier 32 are the same as those of the related art.

Figure 6:
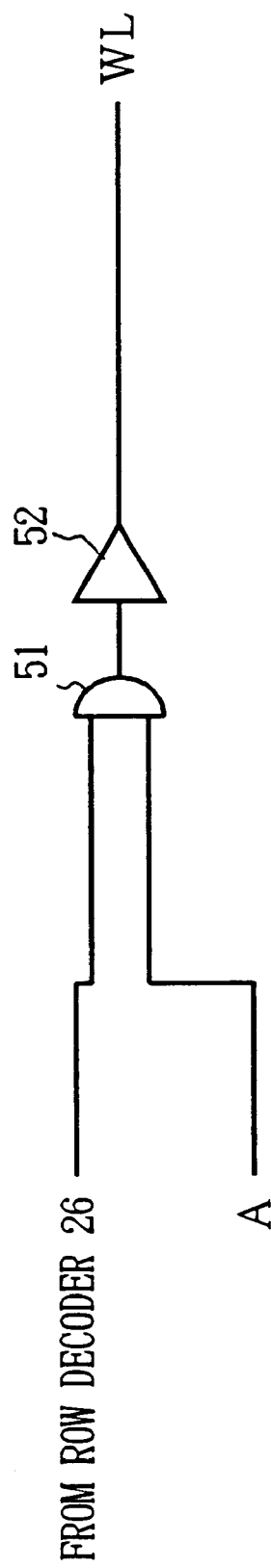
FIG. 6 is a circuit diagram of a word-line buffer.

FIG. 6 is a circuit diagram of the word-line buffer 27.

The word-line buffer 27 of FIG. 6 includes an AND circuit 51 and a buffer circuit 52. The AND circuit 51 performs an AND operation between a decoded signal from the row decoder 26 and the word-line activation pulse A from the pulse-generator circuit 12, and activates an indicated word line WL. By doing so, the word line WL indicated by the input row address can be activated for a time period specified by the word-line-activation pulse A. The word-line buffer 27 includes a plurality of circuits each identical to the circuit of FIG. 4 and provided with respect to each word line.

Figure 7A:
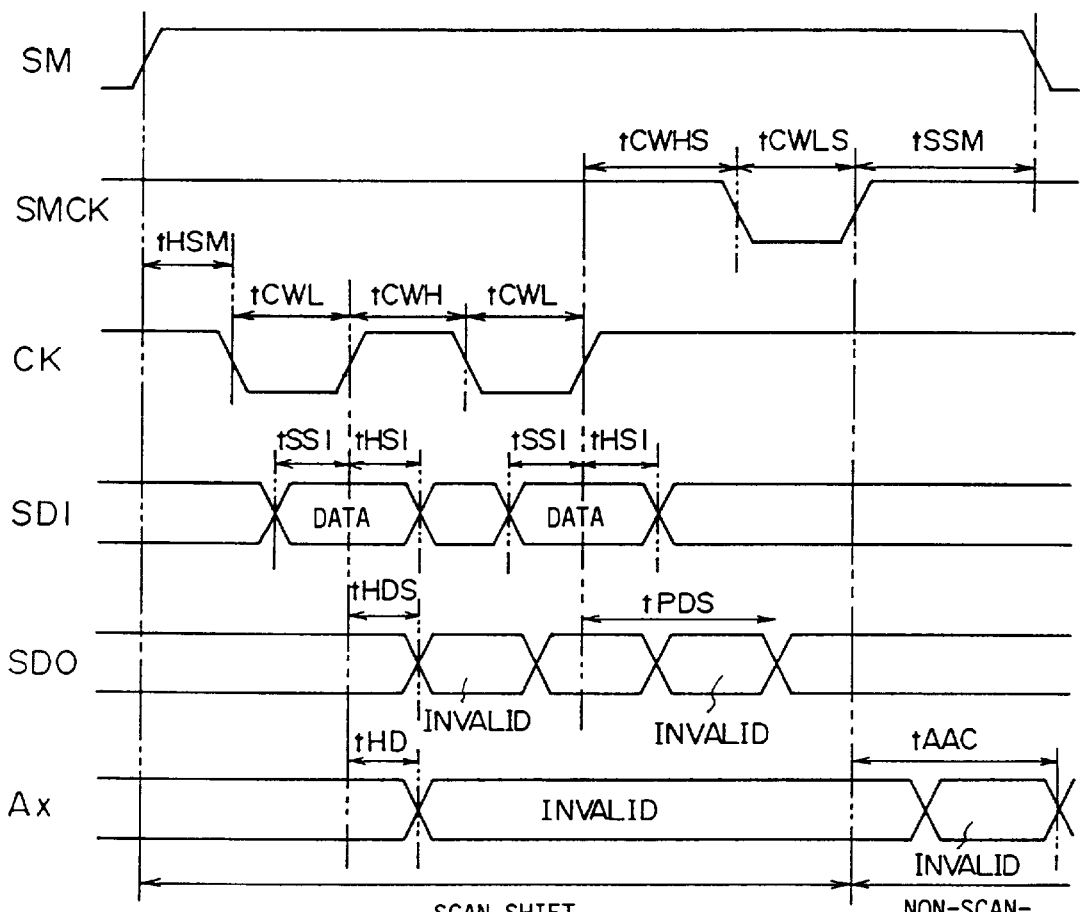
FIGS. 7A and 7B are timing charts showing operations of the semiconductor memory device of FIG. 4 which is equipped with the scan-mode-test circuit of FIG. 3.
Figure 7B:
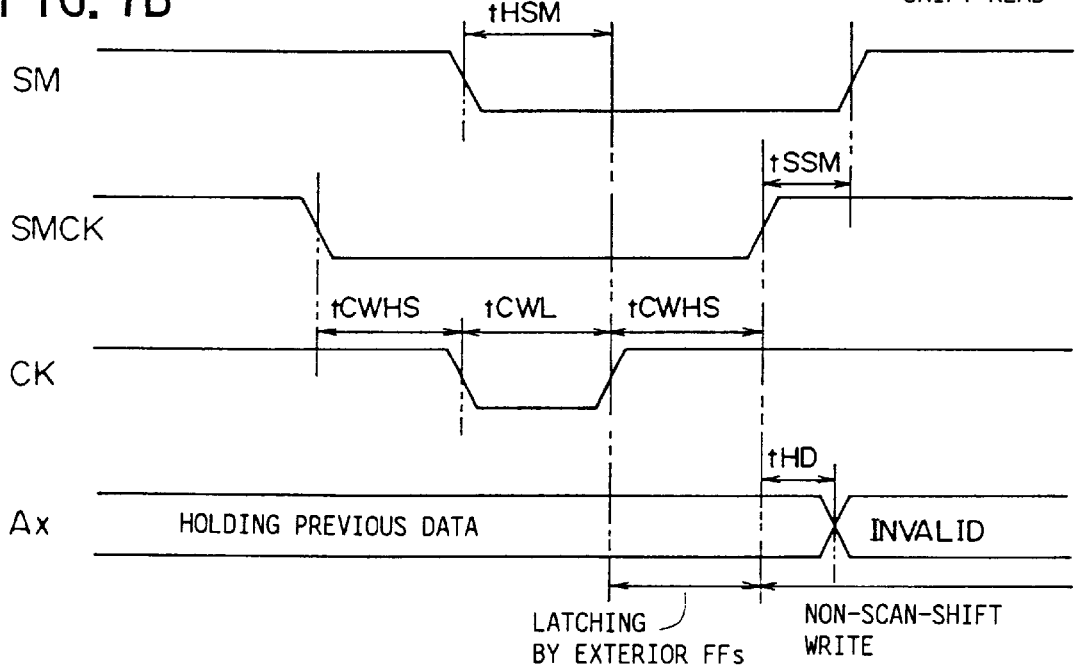

FIGS. 7A and 7B are timing charts showing operations of the semiconductor memory device 20 of FIG. 4 which is equipped with the scan-mode-test circuit 10 of FIG. 3.

FIG. 7A shows the scan-mode-selection signal SM, the scan clock SMCK, the clock signal CK, data SDI which is an SI input to the last scan latch of the chain, data SDO which is an SO output of the last scan latch of the chain, and an output-data signal Ax read from the semiconductor memory device. Here, tCWHS represents a width of a HIGH scan pulse, and tCWLS illustrates a width of a LOW scan pulse. tSSM exhibits a set-up time of a HIGH scan mode. Further, tHSM represents a set-up time of a LOW scan mode. tCWL illustrates a width of a LOW clock pulse, whereas tCWH shows a width of a HIGH clock pulse. Moreover, tSSI is a set-up time of the data SDI, and tHSI is a data-hold time of the data SDI. tHDS represents a data-hold time of the data SDO, while tPDS shows a data-delay time of the data SDO. Finally, tHD is a data-hold time of the read data, and tAAC illustrates an access time of the clock address.

As shown in FIG. 7A, the scan-mode-selection signal SM is set to HIGH to indicate the scan mode. In the scan mode, pulses of the clock signal CK are supplied while the scan-clock signal SMCK is kept at a HIGH level, so that data is set in the scan FFs as manifested by the SDI input and the SDO output in the figure. Since the output of the OR circuit 13 shown in FIG. 3 and FIG. 4 is HIGH at this time, the pulse-generator circuit 12 does not generate a data-write pulse C, thereby writing no data in the memory-cell array 28 of FIG. 4.

After the data is set in the scan FFs, the scan-clock signal SMCK is changed from HIGH to LOW and then changed to HIGH while the clock signal CK is HIGH. A rising edge of this change in the scan-clock signal SMCK initiates a non-scan-shift-read operation. Namely, the rising edge prompts the pulse-generator circuit 12 to generate a data-read pulse, so that data is read from the memory-cell array 28 to the exterior of the semiconductor memory device 20 without shifting the data stored in the scan FFs.

FIG. 7B shows the scan-mode-selection signal SM, the scan-clock signal SMCK, the clock signal CK, and the output data Ax read from the semiconductor memory device.

As shown in FIG. 7B, the clock signal CK is changed while the scan-clock signal SMCK is LOW, so that the output data Ax can be latched by a FF provided outside the semiconductor memory device 20. Since the scan-clock signal SMCK is LOW, the output of the OR circuit 15 shown in FIG. 3 and FIG. 4 is kept at a HIGH level. The data stored in the scan FFs, therefore, does not experience a data shift.

After this, the scan-clock signal SMCK is changed back to HIGH while the scan-mode-selection signal SM is LOW. A rising edge of this change in the scan-clock signal SMCK effects a non-scan-shift-write operation. Namely, the rising edge prompts the pulse-generator circuit 12 to generate a data-write pulse, thereby writing data in the memory-cell array 28 without causing a data shift in the scan FFs.

FIGS. 8A and 8B are table charts showing logic relations between signals with regard to operations of the scan-mode-test circuit 10 of FIG. 3.

FIG. 8A shows a data-read operation and a data-write operation in the normal operation mode, and FIG. 8B shows a scan-shift operation, a non-scan-shift-write operation, a non-scan-shift-read operation, and an exterior-FF-latch operation in the scan mode.

In FIGS. 8A and 8B, "H" indicates that the pertinent signal is HIGH, and "L" indicates that the pertinent signal is LOW. Further, "X" symbolizes "don't care", i.e., a logic level of the pertinent signal does not matter. As shown in the figures, a rising edge of the clock signal CK is used with respect to the data-read/data-write operations in the normal operation mode, the scan operation (i.e., the data setting operation for the scan FFs), and the exterior-FF-latch operation in the scan mode. With respect to the non-scan-shift-write operation and the non-scan-shift-read operation in the scan mode, on the other hand, a rising edge of the scan-clock signal SMCK is used.

In the second embodiment shown in FIG. 4, as described above, data is read or written without making any change to the data stored in the scan FFs when the data-read/data-write operations are conducted after the data is set in each register (scan FF). When data is written in a given address immediately after data is read from the same address, therefore, there is no need to set the scan FFs by inputting the data and the address one bit by one bit. This reduces labor required for setting a test pattern, and, also, shortens a test time.

Figure 9:
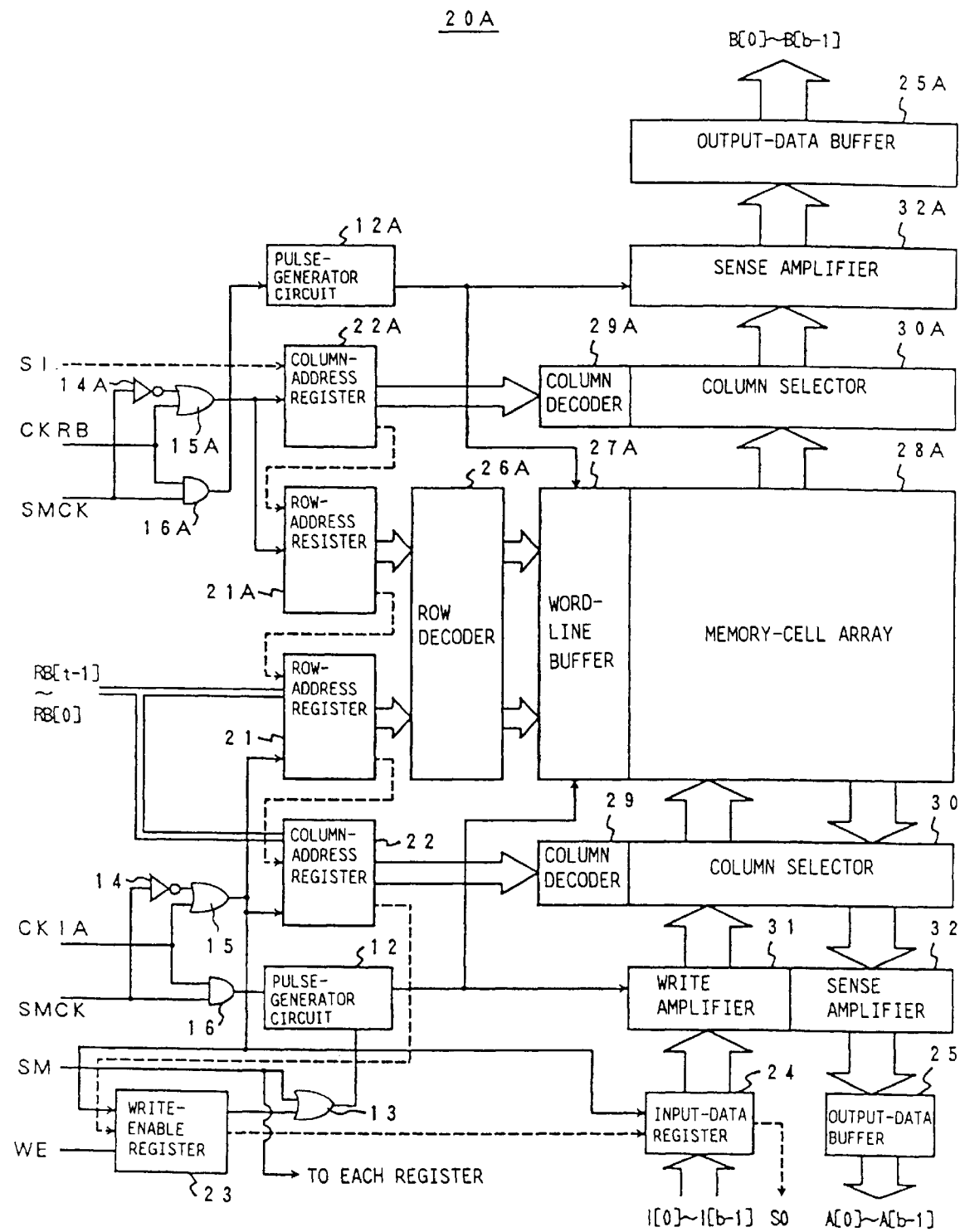
FIG. 9 is a block diagram showing another embodiment of the semiconductor memory device.

FIG. 9 is a block diagram showing another embodiment of the semiconductor memory device. In FIG. 9, the same elements as those of FIG. 4 are referred to by the same numerals, and a description thereof will be omitted.

The embodiment of FIG. 9 is concerned with a 2-port DRAM to which the present invention is applied.

The semiconductor memory device 20A of FIG. 9 includes the OR circuit 13, the inverter 14, an inverter 14A, the OR circuit 15, an OR circuit 15A, the AND circuit 16, an AND circuit 16A, the row-address register 21, a row-address register 21A, the column-address register 22, a column-address register 22A, the write-enable register 23, the input-data register 24, the output-data buffer 25, an output-data buffer 25A, a row decoder 26A, a word-line buffer 27A, a memory-cell array 28A, the column decoder 29, a column decoder 29A, the column selector 30, a column selector 30A, the write amplifier 31, the sense amplifier 32, and a sense amplifier 32A.

The semiconductor memory device 20A of FIG. 9 is a 2-port DRAM, and has a first port for data input/output corresponding to the input-data register 24 and the output-data buffer 25 and a second port for data output corresponding to the output-data buffer 25A. A 2-port DRAM is a well-known configuration in the related art, and a detailed description thereof will be omitted.

In FIG. 9, the elements referred to by reference numbers ending with a suffix "A" are provided in relation with the second port corresponding to the output-data buffer 25A. As shown in the figure, this embodiment uses a clock signal CKIA supplied to the first port and a clock signal CKRB supplied to the second port. These separate clock signals CKIA and CKRB are employed to effect separate scan-mode control with respect to the first port and the second port. The scan-mode control regarding each port is the same as that described in connection with FIG. 4.

In the semiconductor memory device 20A shown in FIG. 9, the separate clock signals are used for separate operation control in the scan mode, so that a data-read operation with respect to the first port and a data-read operation with respect to the second port can be conducted independently of each other.

Figure 10:
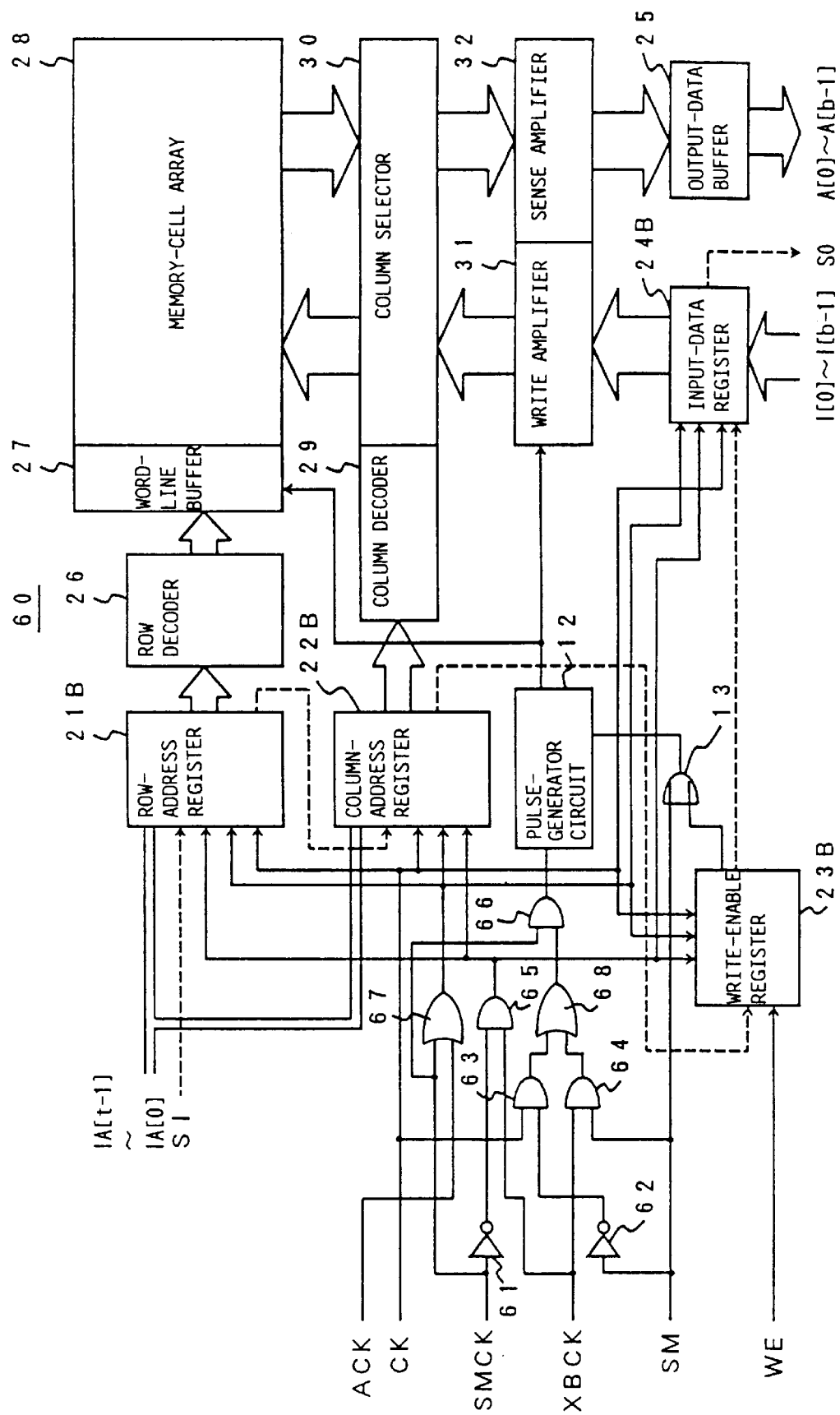
FIG. 10 is a block diagram showing yet another embodiment of the semiconductor memory device.

FIG. 10 is a block diagram showing yet another embodiment of the semiconductor memory device. In FIG. 10, the same elements as those of FIG. 4 are referred to by the same numerals, and a description thereof will be omitted. The embodiment of FIG. 10 shows a case in which LSSD (linear sensitive scan design) FFs are used as scan FFs.

A semiconductor memory device 60 of FIG. 10 includes the OR circuit 13, inverters 61 and 62, AND circuits 63 through 66, OR circuits 67 and 68, a row-address register 21B, a column-address register 22B, a write-enable register 23B, an input-data register 24B, the output-data buffer 25, the row decoder 26, the word-line buffer 27, the memory-cell array 28, the column decoder 29, the column selector 30, the write amplifier 31, and the sense amplifier 32.

In the embodiment of FIG. 10, the scan FFs of each register in FIG. 4 are replaced by LSSD-type FFs. Because of this, the row-address register 21B, the column-address register 22B, the write-enable register 23B, and the input-data register 24B have different configurations from those of FIG. 4 (scan FFs of FIG. 3).

Figure 11:
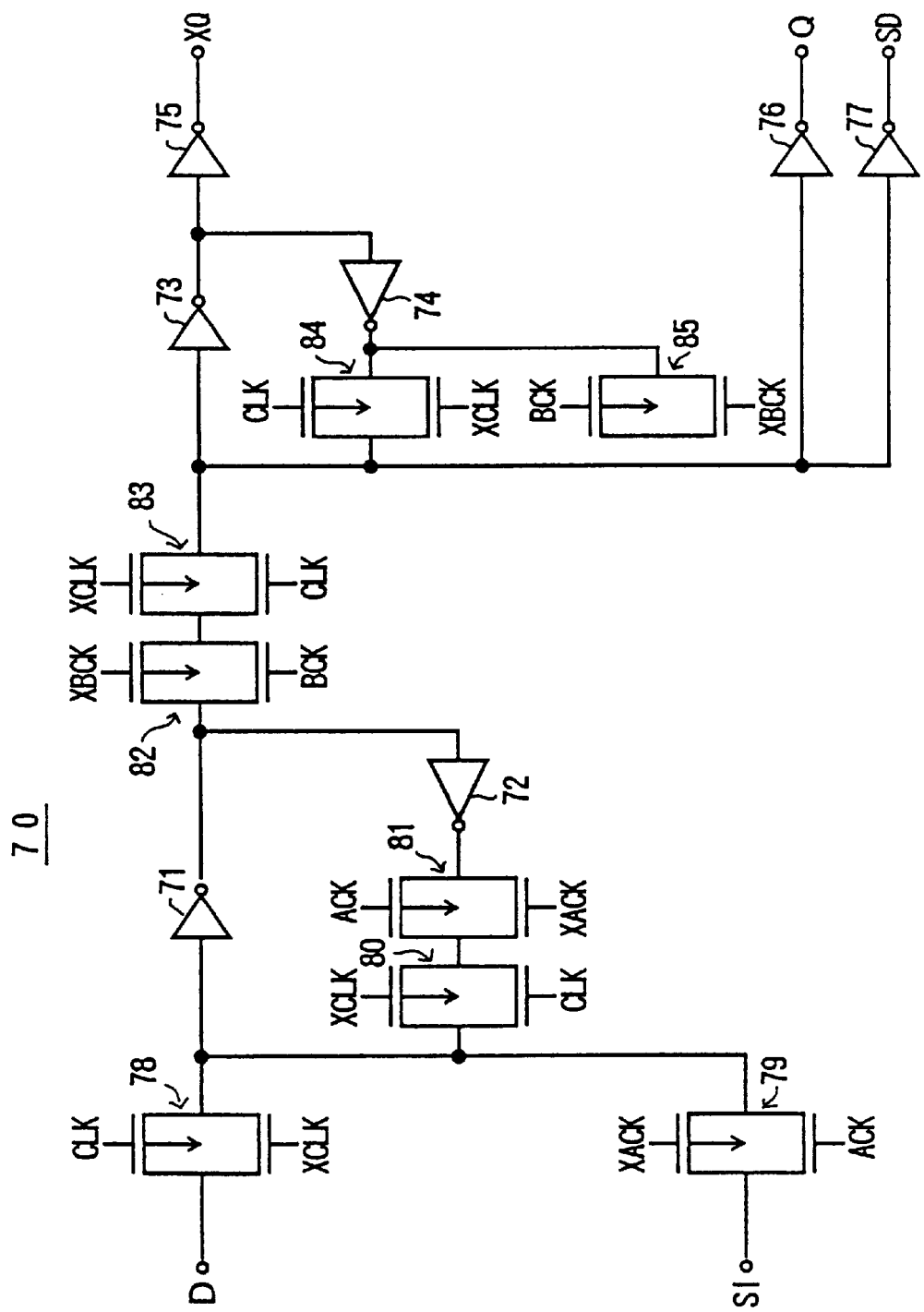
FIG. 11 is a circuit diagram showing a circuit configuration of LSSD-type FFs.

FIG. 11 is a circuit diagram showing a circuit configuration of the LSSD-type FFs.

A LSSD-type FF 70 of FIG. 11 includes inverters 71 through 77 and gates 78 through 85. Each of the gates 78 through 85 is comprised of a pair of a PMOS transistor and an NMOS transistor. The inverters 71 and 72 together form a first latch on a master side, and the inverters 73 and 74 together form a second latch on a slave side. Scan-clock signals ACK and BCK are used in the scan mode, and a clock signal CLK is used in the normal operation mode. Inverse scan-clock signals XACK and XBCK are inverses of the scan-clock signals ACK and BCK, respectively. An inverse clock signal XCLK is an inverse of the clock signal CLK.

In the normal operation mode, the scan-clock signal ACK is kept at a LOW level to close the gate 79. Data to the D input is thus supplied to the first latch. In the scan mode, the clock signal CLK is kept at a HIGH level to close the gate 78 so as to provide data of the SI input for the first latch.

The first latch latches the supplied data at a timing when the scan-clock signal ACK becomes HIGH. When this happens, the gate 82 controlled by the scan-clock signal BCK is closed. After this, the gate 82 is opened, so that the data of the first latch is stored in the second latch. At this time, the gate 78 and the gate 79 supplying an input to the first latch are closed.

In this manner, data is first stored in the first latch. Then, the input path to the first latch is closed as the path to the second latch is opened to store the data in the second latch. When next data is to be stored in the first latch, the path to the second latch is closed again. These operations can avoid an undesirable circumstance in which the input data directly passes through the circuit to reach the output end, which could happen due to timing misalignment of the gates. The LSSD-type FFs thus insure reliable operations.

In FIG. 10, the clock signal CK is supplied to each register at all times. The scan-clock signal ACK and the inverse scan-clock signal XBCK are supplied to each register via the OR circuit 67 and AND circuit 65, respectively, only when the scan-clock signal SMCK is LOW. Using the scan-clock signal ACK and the inverse scan-clock signal XBCK, the LSSD-type FFs in each register store serial data supplied from the SI input. Here, the inverse scan-clock signal XACK and the scan clock BCK may be generated by using inverters in each register.

In the data-read operation and the data-write operation during the scan mode, the scan-clock signal SMCK is changed to HIGH to stop supply of the scan-clock signal ACK and the inverse scan-clock signal XBCK.

A logic circuit comprised of the inverter 62, the AND circuits 63 and 64, and the OR circuit 68 supplies the inverse scan-clock signal XBCK to the AND circuit 66 in the scan mode indicated when the scan-mode-selection signal SM is HIGH. In the normal operation mode indicated when the scan-mode-selection signal SM is LOW, the clock signal CK is supplied to the AND circuit 66. In the data-read operation and the data-write operation, an output of the OR circuit 68 is supplied to the pulse-generator circuit 12 via the AND circuit 66 since the scan-clock signal SMCK is HIGH. Since the scan-clock signal ACK and the inverse scan-clock signal XBCK are not supplied to each register in this case, data in each register does not experience a data shift.

In this manner, the embodiment of FIG. 10 can insure reliable data-latch operations by use of the LSSD-type scan FFs. Further, the embodiment of FIG. 10, in the same manner as in the embodiment of FIG. 4, sets data in the scan FFs, and performs data-read/write operations without making any undesirable change to the data stored in the scan FFs. When data is to be written in an address immediately after data is read from the same address, therefore, there is no need to set the scan FFs again by inputting the data and the address one bit by one bit. This achieves a reduction in labor required for setting a test pattern, and, also, serves to shorten the test time.

Further, the present invention is not limited to these embodiments, but various variations and modifications may be made without departing from the scope of the present invention.

What is claimed is:

1. A semiconductor memory device comprising:
   a column-address register including a plurality of scan flip-flops connected in series for storing parallel bits of address signal provided in a normal operation mode and for storing serial bits of address signal externally provided in a scan mode by shifting said serial address signal; and
   a control circuit which enables said plurality of scan flip-flops to refrain from shifting said serial bits of address signal stored in said plurality of scan flip-flops, and causes the column-address register to maintain the address signal for a data-read operation during the following data-write operation in said scan mode.

2. The semiconductor memory device as claimed in claim 1, wherein said plurality of scan flip-flops operate in synchronism with a clock signal, and wherein said control circuit supplies said clock signal to said plurality of scan flip-flops when said serial bits of address signal are externally provided in said scan mode, and stops supply of said clock signal to said plurality of scan flip-flops when said data-read operations and said data-write operations are conducted in said scan mode.

3. The semiconductor memory device as claimed in claim 2, wherein said control circuit receives said clock signal and a control signal, and controls supply of said clock signal to said plurality of scan flip-flops based on a logic operation between said clock signal and said control signal.

4. The semiconductor memory device as claimed in claim 1, further comprising a pulse generator circuit which generates a pulse signal under control of said control circuit in order to control data-read operations and data-write operations in said normal operation mode and in said scan mode.

5. The semiconductor memory device as claimed in claim 4, further comprising a word-line buffer circuit which activates a selected word line for a time period indicated by said pulse signal supplied from said pulse generator circuit.

6. The semiconductor memory device as claimed in claim 1, wherein said plurality of scan flip-flops comprises LSSD-type flip-flops.

7. The semiconductor memory device as claimed in claim 1, further comprising a plurality of ports, wherein said control circuit controls said plurality of scan flip-flops independently with respect to each of said ports.

* * * * *